(12) United States Patent
Matsubara

(10) Patent No.: US 10,128,848 B2
(45) Date of Patent: *Nov. 13, 2018

(54) LEVEL SHIFTER

(71) Applicant: KABUSHIKI KAISHA TOKAI-RIKA-DENKI-SEISAKUSHO, Aichi-ken (JP)

(72) Inventor: Junichi Matsubara, Aichi-ken (JP)

(73) Assignee: KABUSHIKI KAISHA TOKAI-RIKA-DENKI-SEISAKUSHO, Aichi-Ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/854,870

(22) Filed: Dec. 27, 2017

(65) Prior Publication Data

US 2018/0212604 A1    Jul. 26, 2018

(30) Foreign Application Priority Data

Jan. 25, 2017 (JP) .................. 2017-011459
Oct. 4, 2017 (JP) .................. 2017-194179

(51) Int. Cl.
*H03K 19/0185*   (2006.01)
*H01L 27/02*   (2006.01)
*H03K 19/0175*   (2006.01)

(52) U.S. Cl.
CPC . *H03K 19/018521* (2013.01); *H01L 27/0288* (2013.01); *H03K 19/017509* (2013.01)

(58) Field of Classification Search
CPC ....... H03K 19/018521; H03K 19/0175; H03K 19/017509; H03K 19/0185; H03K 19/018507; H01L 27/0288; G06F 3/00
See application file for complete search history.

(56) References Cited

U.S. PATENT DOCUMENTS 7,109,761 B2 * 9/2006 Isomura ............. H03K 3/02337
327/321
7,830,182 B2 * 11/2010 Suzuki ................. H03K 5/2472
327/50
2015/0358003 A1   12/2015 Kihara

FOREIGN PATENT DOCUMENTS

JP       5465548 B2    4/2014
WO    9618240 A1    6/1996

OTHER PUBLICATIONS

Extended European Search Report issued in European Application No. 18150031.5 dated Jun. 15, 2018.

* cited by examiner

*Primary Examiner* — Jung Kim
(74) *Attorney, Agent, or Firm* — Roberts, Mlotkowski, Safran, Cole & Calderon, P.C.

(57) ABSTRACT

A level shifter that includes: a power supply system current source; a second transistor having a third main electrode that is connected to an input voltage signal terminal, a fourth main electrode that is connected to an output voltage signal terminal, and a second control electrode that is connected to a third power supply voltage having a voltage that is lower than a first power supply voltage and higher than a second power supply voltage; a second resistor; and a third transistor having a fifth main electrode that is connected to the second end of the second resistor, a sixth main electrode that is connected to the second power supply voltage, and a third control electrode that is connected to a first control electrode of a first transistor of the power supply system current source.

5 Claims, 4 Drawing Sheets

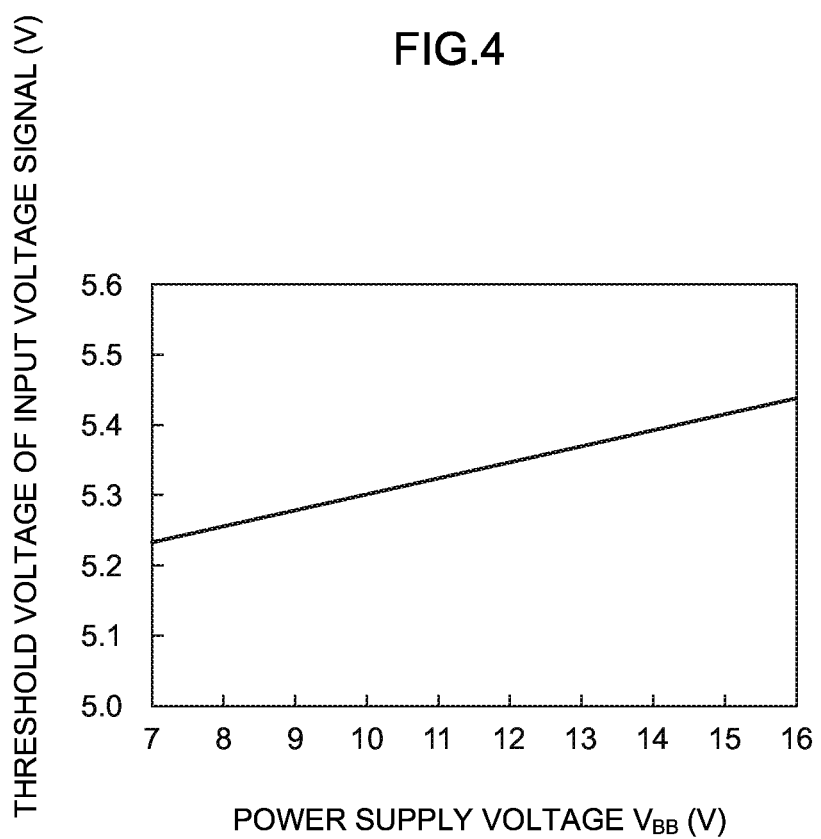

LEVEL SHIFTER

CROSS-REFERENCE TO RELATED APPLICATION

This application is based on and claims priority under 35 USC 119 from Japanese Patent Applications No. 2017-011459 filed on Jan. 25, 2017 and No. 2017-194179 filed on Oct. 4, 2017, which are incorporated by reference herein.

BACKGROUND

Technical Field

The present invention relates to a level shifter.

Related Art

Japanese Patent No. 5,465,548 discloses a level shifter that converts a high voltage supplied from an in-vehicle battery to a low voltage that is usable in an engine control unit (ECU) and the like. This level shifter includes a level shift section. The level shift section inputs an input voltage signal and outputs an output voltage signal that is level-shifted from the high voltage to the low voltage. This level shifter has a circuit configuration in which the voltage level of a threshold voltage of the input voltage signal is constant, even if the voltage level of the high voltage supplied from the in-vehicle battery changes.

When, for example, there is a voltage drop at the in-vehicle battery, then if the threshold voltage is constant, the input voltage signal at the high level may not actually reach the threshold voltage and may be judged to be at a low level. Thus, misoperation may occur. Accordingly, there are calls for a level shifter in which the threshold voltage of an input voltage signal is changed in accordance with voltage changes.

SUMMARY

In consideration of the circumstances described above, the present disclosure provides a level shifter in which a threshold voltage of an input voltage signal may be changed in accordance with a change in a power supply voltage.

A level shifter according to an aspect of the present disclosure includes: a power supply system current source including: a first resistor having a first end that is connected to a first power supply voltage, and having a second end, and a first transistor having a first main electrode and a first control electrode that are connected to the second end of the first resistor, and having a second main electrode that is connected to a second power supply voltage having a lower voltage than the first power supply voltage; a second transistor having a third main electrode that is connected to an input voltage signal terminal, a fourth main electrode that is connected to an output voltage signal terminal, and a second control electrode that is connected to a third power supply voltage having a voltage that is lower than the first power supply voltage and higher than the second power supply voltage; a second resistor having a first end that is connected between the fourth main electrode and the output voltage signal terminal, and having a second end; and a third transistor having a fifth main electrode that is connected to the second end of the second resistor, a sixth main electrode that is connected to the second power supply voltage, and a third control electrode that is connected to the first control electrode.

BRIEF DESCRIPTION OF DRAWINGS

FIG. 4 is a characteristic of the level shifter illustrated in FIG. 1, depicting changes in a threshold voltage of an input voltage signal $S_{IN}$ with respect to changes in a power supply voltage $V_{BB}$.

DETAILED DESCRIPTION

A level shifter according to an exemplary embodiment of the present disclosure is described below using FIG. 1 to FIG. 4. In this exemplary embodiment, structural elements that have the same functions or substantially the same functions are assigned the same reference symbols, and duplicative descriptions are omitted.

—Circuit Configuration of Level Shifter 1—

Figure 1:
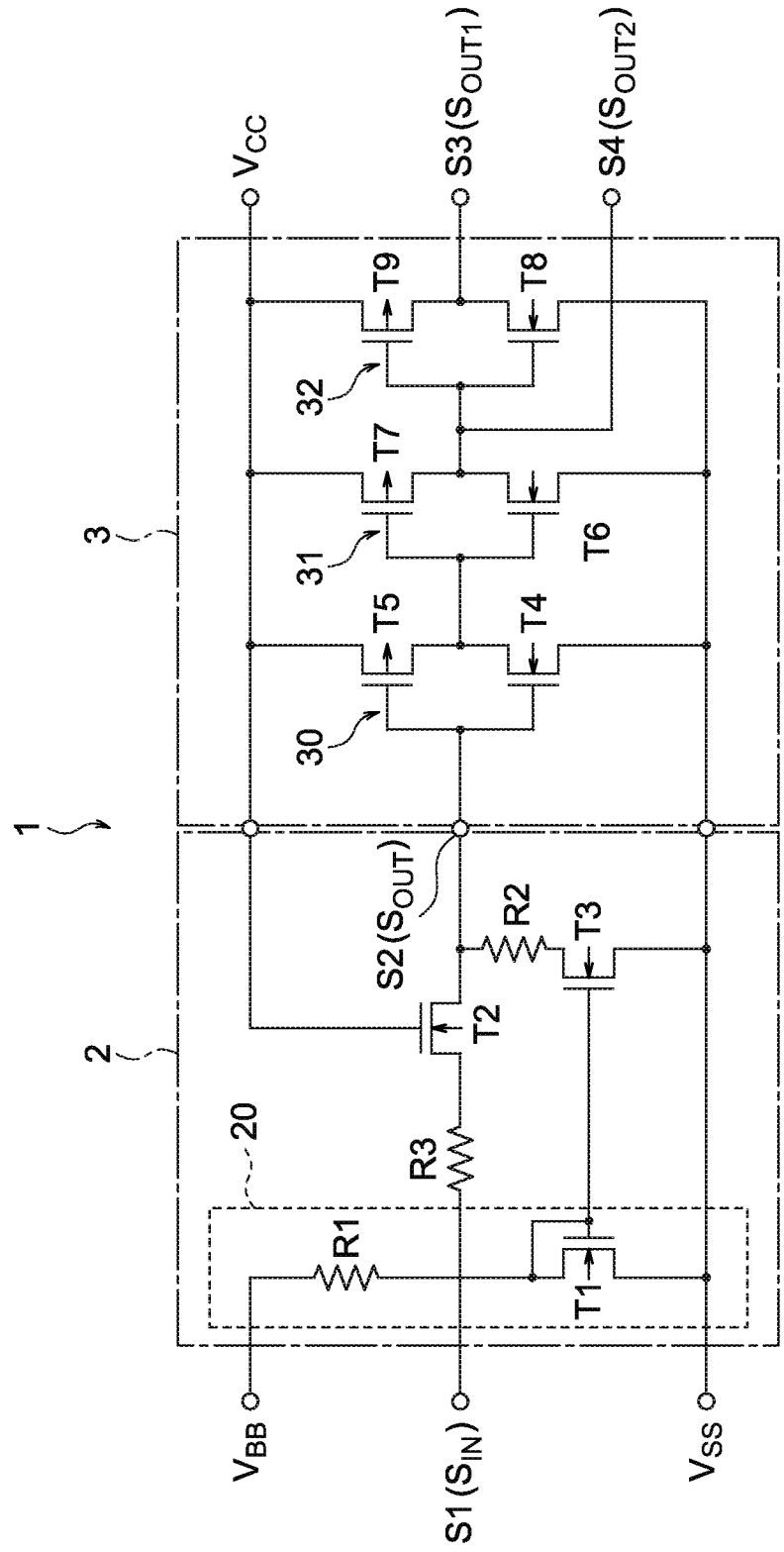
FIG. 1 is a circuit diagram of a level shifter according to an exemplary embodiment of the present disclosure.

As illustrated in FIG. 1, a level shifter 1 according to the present exemplary embodiment is driven by a first power supply voltage $V_{BB}$ with a high voltage that is supplied from an in-vehicle battery. The level shifter 1 is structured with a level shift section 2 and a buffer section 3. The level shifter 1 outputs an output voltage signal $S_{OUT1}$ and an inverted output voltage signal $S_{OUT2}$, which are level-shifted from the first power supply voltage $V_{BB}$ to a lower voltage in accordance with an input voltage signal $S_{IN}$ at lower voltages than the first power supply voltage $V_{BB}$. The input voltage signal $S_{IN}$ is applied to an input voltage signal terminal S1 of the level shifter 1. The output voltage signal $S_{OUT1}$ is outputted to an output voltage signal terminal S3, and the output voltage signal $S_{OUT2}$ is outputted to an output voltage signal terminal S4.

The first power supply voltage $V_{BB}$ is, for example, between 8 V and 18 V. The input voltage signal $S_{IN}$ is, for example, a rising signal from 0 V (low level) to 6 V (high level) or a falling signal from 6 V to 0 V. The output voltage signal $S_{OUT1}$ is, for example, a rising signal from 0 V (low level) to 5 V (high level) or a falling signal from 5 V to 0 V. The inverted output voltage signal $S_{OUT2}$ is an inverted voltage signal of the output voltage signal $S_{OUT1}$. A second power supply voltage $V_{SS}$ is 0 V.

(1) Structure of Level Shift Section 2

The level shift section 2 of the level shifter 1 includes a power supply system current source 20, a second transistor T2, a second resistor R2 and a third transistor T3. The power supply system current source 20 is provided with a first resistor R1 and a first transistor T1. An electrostatic protection component is disposed at the level shift section 2. In the present exemplary embodiment, the electrostatic protection component is structured by a third resistor R3.

To describe this in more detail, one end of the first resistor R1 of the power supply system current source 20 is connected to the first power supply voltage $V_{BB}$.

The first transistor T1 is structured by an insulated gate field-effect transistor (IGFET) of the n-channel conduction type, which serves as a first conduction type in the present exemplary embodiment. IGFETs include at least metal-oxide-semiconductor (MOS)FETs and metal-insulator-semiconductor (MIS)FETs. A first main electrode (the drain electrode) of the first transistor T1 is connected to the other end of the first resistor R1, and a second main electrode (the source electrode) of the first transistor T1 is connected to the second power supply voltage $V_{SS}$. A first control electrode (the gate electrode) of the first transistor T1 is connected to both the first resistor R1 and a third control electrode (the gate electrode) of the third transistor T3.

The second transistor T2 is structured by a high-breakdown-voltage transistor with a higher electrostatic breakdown voltage than an electrostatic breakdown voltage of the first transistor T1. In the present exemplary embodiment, the second transistor T2 is structured by a vertical diffused metal-oxide-semiconductor field effect transistor (VDMOSFET). This second transistor T2 may simply be referred to as a VDMOSFET or a vertical diffused-type transistor). The second transistor T2 is specified to be of the first conduction type.

A third main electrode (the drain electrode) of the second transistor T2 is connected to the input voltage signal terminal S1, and a fourth main electrode (the source electrode) of the second transistor T2 is connected to an output voltage signal terminal S2 of the level shift section 2. An output signal voltage $S_{OUT}$ in which the high voltage of the first power supply voltage $V_{BB}$ has been level-shifted to a low voltage is outputted at the output voltage signal terminal S2. A second control electrode (the gate electrode) of the second transistor T2 is connected to a third power supply voltage $V_{CC}$. This third power supply voltage $V_{CC}$ is a voltage that is lower than the first power supply voltage $V_{BB}$ but higher than the second power supply voltage $V_{SS}$, specifically being 5 V. The second transistor T2 acts as a clamp transistor that does not output signals above a certain voltage to the output voltage signal terminal S2.

One end of the second resistor R2 is connected to between the fourth main electrode of the second transistor T2 and the output voltage signal terminal S2. The second resistor R2 is used for regulation of a threshold voltage of the input voltage signal $S_{IN}$.

The third transistor T3 is structured by an IGFET of the first conduction type, which is constituted with a similar structure to the first transistor T1. A fifth main electrode (the drain electrode) of the third transistor is connected to the other end of the second resistor R2, and a sixth main electrode (the source electrode) of the third transistor T3 is connected to the second power supply voltage $V_{SS}$. As mentioned above, the third control electrode is connected to the first control electrode of the first transistor T1. Therefore, the third transistor T3 constitutes a current mirror circuit with the first transistor T1.

The third resistor R3 serves as the electrostatic protection component. One end of the third resistor R3 is connected to the input voltage signal terminal S1, and the other end is connected to the third main electrode of the second transistor T2. Although the electrostatic protection component is structured by the third resistor R3 in the present exemplary embodiment, the electrostatic protection component may be structured in the present exemplary embodiment by using a reverse-connected diode or combining a diode and a resistor.

(2) Structure of Buffer Section 3

In the present exemplary embodiment, the buffer section 3 of the level shifter 1 includes three stages that are electrically connected in series: a first inverter 30, a second inverter 31 and a third inverter 32.

The first inverter 30 includes a fourth transistor T4 and a fifth transistor T5.

To describe this in more detail, the fourth transistor T4 is structured by an IGFET of the first conduction type. One main electrode of the fourth transistor T4, which is the source electrode, is connected to the second power supply voltage $V_{SS}$. The other main electrode of the fourth transistor T4, which is the drain electrode, is connected to the other main electrode of the fifth transistor T5, which is the drain electrode thereof, and to gate electrodes of the second inverter 31. The gate electrode of the fourth transistor T4 is connected to the output voltage signal terminal S2.

The fifth transistor is structured by an IGFET of the p-channel conduction type, which serves as a second conduction type. One main electrode of the fifth transistor T5, which is the source electrode, is connected to the third power supply voltage $V_{CC}$. The drain electrode of the fifth transistor T5 is connected to the drain electrode of the fourth transistor T4 and to the gate electrodes of the second inverter 31. The gate electrode of the fifth transistor T5 is connected to the output voltage signal terminal S2.

The first inverter 30 shapes a waveform of the output voltage signal $S_{OUT}$ that is outputted from the output voltage signal terminal S2.

The second inverter 31 is arranged as a circuit succeeding the first inverter 30, and includes a sixth transistor T6 and a seventh transistor T7. The sixth transistor T6 is constituted with a similar structure to the fourth transistor T4, and the seventh transistor T7 is constituted with a similar constituted to the fifth transistor T5. The gate electrodes of the sixth transistor T6 and the seventh transistor T7 are connected to the first inverter 30. The drain electrodes of the sixth transistor T6 and the seventh transistor T7 are connected to the third inverter 32 and to an output voltage signal terminal S4. The inverted output voltage signal $S_{OUT2}$ is outputted at the output voltage signal terminal S4.

The third inverter 32 is arranged as a circuit succeeding the second inverter 31, and includes an eighth transistor T8 and a ninth transistor T9. The eighth transistor T8 is constituted with a similar structure to the fourth transistor T4, and the ninth transistor T9 is constituted with a similar structure to the fifth transistor T5. The gate electrodes of the eighth transistor T8 and the ninth transistor T9 are connected to the second inverter 31. The drain electrodes of the eighth transistor T8 and the ninth transistor T9 are connected to the output voltage signal terminal S3. The output voltage signal $S_{OUT1}$ is outputted at the output voltage signal terminal S3.

—Device Structure of the Level Shifter—

Figure 2:
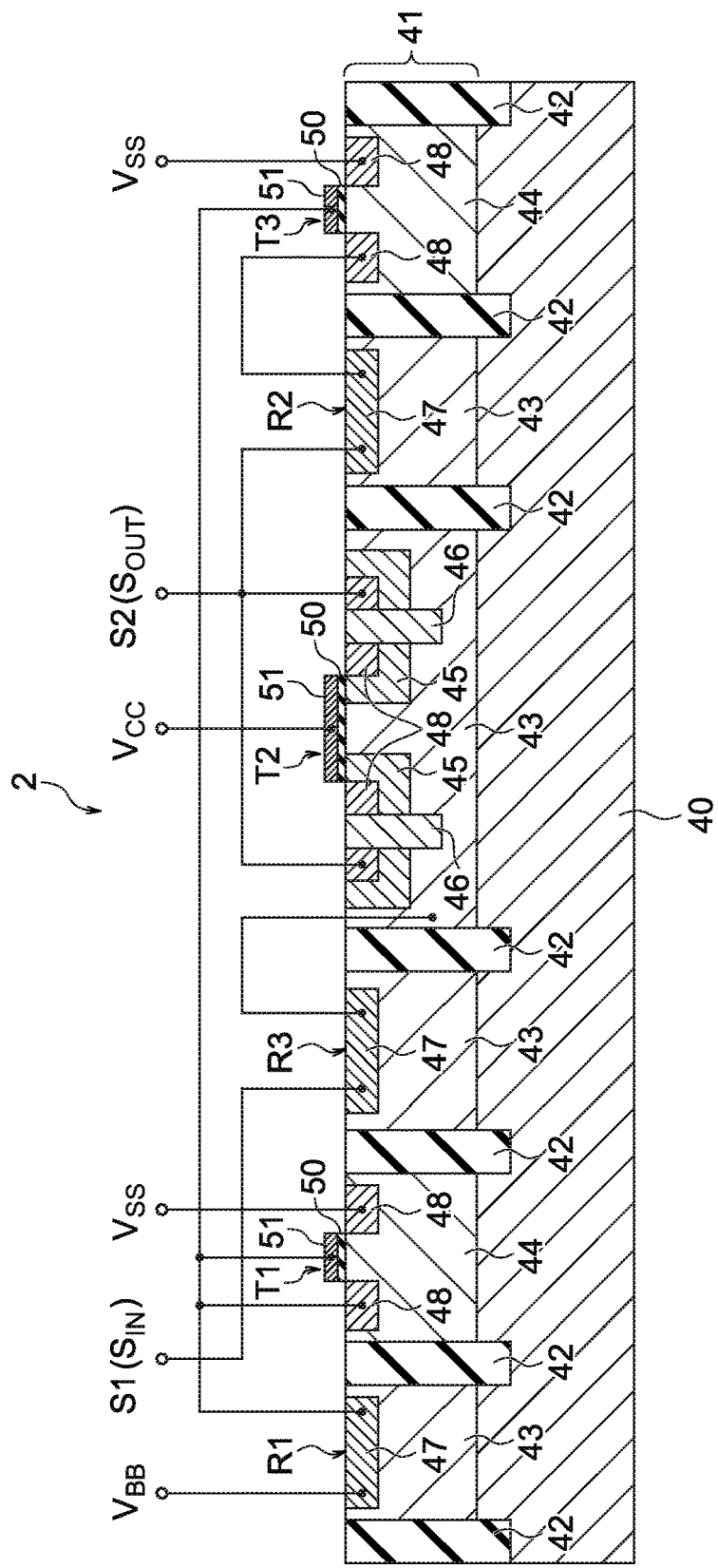
FIG. 2 is a vertical sectional structural diagram of components structuring a level shift section of the level shifter illustrated in FIG. 1.
Figure 3:
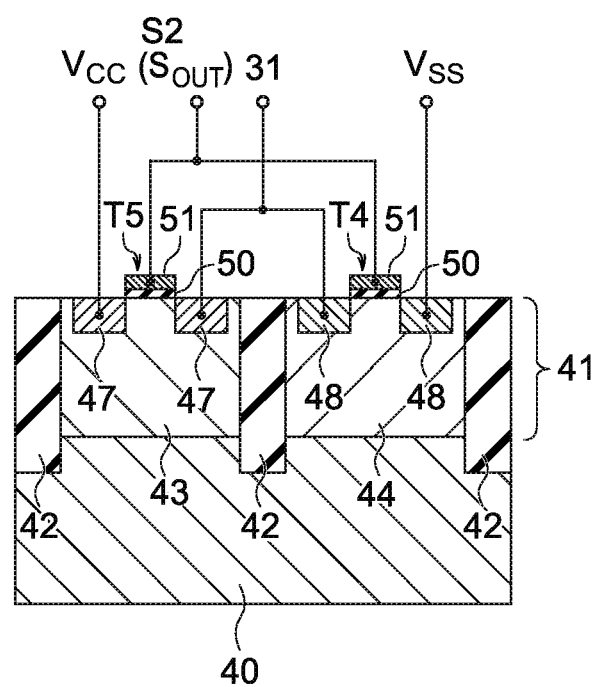
FIG. 3 is a vertical sectional structural diagram, corresponding to FIG. 2, of components structuring a portion of a buffer section of the level shifter illustrated in FIG. 1.

The level shifter 1 according to the present exemplary embodiment is structured as a semiconductor integrated circuit (a semiconductor device). As illustrated in FIG. 2 and FIG. 3, the level shifter 1 is formed with a semiconductor substrate 40 serving as a base. In the present exemplary embodiment, an n-type silicon monocrystalline substrate is employed for the semiconductor substrate 40.

As illustrated in FIG. 2, the respective semiconductor components of the level shift section 2—the first resistor R1, second resistor R2 and third resistor R3 and the first transistor T1, second transistor T2 and third transistor T3—are formed on an n-type epitaxial growth layer 41 that is formed on the principal surface of the semiconductor substrate 40. The respective semiconductor components are formed within a region of the epitaxial growth layer 41 whose periphery is encircled by a component isolation region 42.

The first resistor R1 is formed by a second conduction type (p-type) semiconductor region 47 disposed in a principal surface portion of a first conduction type (n-type) well region 43 that is formed in the epitaxial growth layer 41. The second resistor R2 and the third resistor R3 are structured with similar vertical cross-section structures to the first resistor R1.

The first transistor T1 is disposed in a principal surface portion of a second conduction type well region 44 that is formed in the epitaxial growth layer 41. To describe this in more detail, the first transistor T1 is structured with a channel formation region formed by the well region 44, a pair of first conduction type semiconductor regions 48 to be used as the first main electrode and the second main electrode, a gate isolation layer 50, and a gate electrode 51 to serve as the first control electrode. The pair of semiconductor regions 48 are formed in principal surface portions of the well region 44 that are separated from one another with the channel formation region therebetween. The gate isolation layer 50 is formed on the channel formation region (on the principal surface of the well region 44). The gate electrode 51 is formed on the gate isolation layer 50.

The third transistor T3 is structured with a similar vertical cross-section structure to the first transistor T1.

As mentioned above, the second transistor T2 is structured by a VDMOSFET in the present exemplary embodiment. To describe this in more detail, the second transistor T2 is structured with the third main electrode, a channel formation region, the fourth main electrode, another of the gate isolation layer 50, and another of the gate electrode 51 to serve as the second control electrode. The third main electrode is structured with another of the well region 43. An impurity density of the well region 43 is specified to be lower than the impurity densities of the semiconductor substrate 40 and the semiconductor region 48. The channel formation region is formed at principal surface portions of second conduction type base regions 45 that are formed in principal surface portions of the well region 43 at end portions of the gate electrode 51. The base regions 45 connect with second conduction type semiconductor regions 46 with higher impurity densities than the base regions 45. The fourth main electrode is formed by another of the semiconductor region 48 that is formed at a principal surface portion of the base regions 45. The impurity density of the semiconductor region 48 is specified to be higher than the impurity density of the semiconductor substrate 40. The gate isolation layer 50 is formed on the channel formation region (on the principal surface of the base regions 45), and the gate electrode 51 is formed on the gate isolation layer 50.

Meanwhile, as illustrated in FIG. 3, the fourth transistor T4 of the first inverter 30 of the buffer section 3 is formed at the principal surface portion of the well region 44 within a region whose periphery is encircled by the component isolation region 42.

The fourth transistor T4 is structured with another of the well region 44 to serve as a channel formation region, another pair of the semiconductor regions 48 to serve as the one main electrode and the other main electrode, another of the gate isolation layer 50, and another of the gate electrode 51. That is, the fourth transistor T4 is structured with a similar vertical cross-section structure to the first transistor T1 and the third transistor T3.

The fifth transistor T5 is structured with another of the well region 43 to serve as a channel region, another pair of the semiconductor regions 47 to serve as the one main electrode and the other main electrode, another of the gate isolation layer 50, and another of the gate electrode 51.

Although not shown in the drawings, the sixth transistor T6 of the second inverter 31 and the eighth transistor T8 of the third inverter 32 are structured with similar vertical cross-section structures to the fourth transistor T4, and the seventh transistor T7 of the second inverter 31 and the ninth transistor T9 of the third inverter 32 are structured with similar vertical cross-section structures to the fifth transistor T5.

Operation and Effects of the Present Exemplary Embodiment

As illustrated in FIG. 1, the level shifter 1 according to the present exemplary embodiment includes the level shift section 2. The level shift section 2 is provided with the power supply system current source 20, the second transistor T2, the second resistor R2 and the third transistor T3. The power supply system current source 20 includes the first resistor R1 and the first transistor T1. The one end of the first resistor R1 is connected to the first power supply voltage $V_{BB}$. The first main electrode and first control electrode of the first transistor T1 are connected to the other end of the first resistor R1. The second main electrode of the first transistor $V_{SS}$ is connected to the second power supply voltage $V_{SS}$. The second power supply voltage $V_{SS}$ is set to a lower voltage than the first power supply voltage $V_{BB}$.

The third main electrode of the second transistor T2 is connected to the input voltage signal terminal S1, and the fourth main electrode of the second transistor T2 is connected to the output voltage signal electrode S2. The second control electrode of the second transistor T2 is connected to the third power supply voltage $V_{CC}$. The third power supply voltage $V_{CC}$ is at a voltage lower than the first power supply voltage $V_{BB}$ but higher than the second power supply voltage $V_{SS}$.

The one end of the second resistor R2 is connected to between the fourth main electrode of the second transistor T2 and the output voltage signal terminal S2. The fifth main electrode of the third transistor T3 is connected to the other end of the second resistor R2, and the sixth main electrode of the third transistor T3 is connected to the second power supply voltage $V_{SS}$. The third control electrode of the third transistor T3 is connected to the first control electrode of the first transistor T1.

Because the third control electrode of the third transistor T3 is connected to the first control electrode of the first transistor T1, the third transistor T3 constitutes a current mirror circuit with the power supply system current source 20 (the first transistor T1). In the power supply system current source 20, a current flowing from the first power supply voltage $V_{BB}$ through the first resistor R1 and the first transistor T1 to the second power supply voltage $V_{SS}$ changes in accordance with a change in the voltage level of the first power supply voltage $V_{BB}$. Thus, current regulation is implemented. When the input voltage signal $S_{IN}$ is applied to the input voltage signal terminal S1, the input voltage signal $S_{IN}$ passes through the second transistor T2, the second resistor R2 and the third transistor T3, and is outputted at the second power supply voltage $V_{SS}$ as a current. In accordance with the change in the current flowing in the first transistor T1 of the power supply system current source 20, the current flowing in the third transistor T3 that constitutes the current mirror circuit is regulated.

Therefore, because the current flowing in the second resistor R2 is regulated in accordance with the current regulation of the power supply system current source 20, the voltage level of a threshold value of the input voltage signal $S_{IN}$ may be changed.

FIG. 4 is a characteristic of the level shift section 2 depicting changes in the voltage level of the threshold voltage of the input voltage signal $S_{IN}$ with respect to changes in the voltage level of the first power supply voltage $V_{BB}$. The horizontal axis represents changes in the first power supply voltage $V_{BB}$ (V) and the vertical axis represents changes in the threshold voltage. According to this characteristic, when the first power supply voltage $V_{BB}$ is 16 V, the threshold voltage of the input voltage signal $S_{IN}$ is 5.43 V. If the first power supply voltage $V_{BB}$ falls to 7 V due to a voltage drop, the threshold voltage of the input voltage signal $S_{IN}$ changes to 5.24 V. The threshold voltage changes linearly with respect to changes in the first power supply voltage $V_{BB}$.

Thus, according to the level shifter 1 according to the present exemplary embodiment, the threshold voltage of the input voltage signal $S_{IN}$ may be changed in accordance with changes in the first power supply voltage $V_{BB}$.

Moreover, in the level shifter 1 according to the present exemplary embodiment, as illustrated in FIG. 1, the electrostatic protection component, specifically the third resistor R3, is disposed between the input voltage signal terminal S1 and the second transistor T2. Therefore, electrostatic breakdown of the second transistor T2 may be prevented or effectively suppressed, and the electrostatic breakdown endurance of the level shifter 1 may be improved.

In the level shifter 1 according to the present exemplary embodiment, as illustrated in FIG. 1 and FIG. 2, an electrostatic breakdown voltage of the second transistor T2 is specified to be high. Therefore, electrostatic breakdown of the second transistor T2 may be prevented or effectively suppressed, and the electrostatic breakdown endurance of the level shifter 1 may be improved.

In the level shifter 1 according to the present exemplary embodiment, as illustrated in FIG. 1 and FIG. 2, the second transistor T2 is a VDMOSFET. Therefore, the electrostatic breakdown voltage of the second transistor T2 may be improved, and the electrostatic breakdown endurance of the level shifter 1 may be improved.

In the level shifter 1 according to the present exemplary embodiment, as illustrated in FIG. 1, the buffer section 3 is connected to the output voltage signal terminal S2 of the level shift section 2. Therefore, the waveform of the output voltage signal $S_{OUT}$ that is outputted from the output voltage signal terminal S2 may be shaped using the buffer section 3. Hence, the shaped output voltage signal $S_{OUT1}$ may ultimately be outputted to the output voltage signal terminal S3 and, similarly, the shaped inverted output voltage signal $S_{OUT2}$ may ultimately be outputted to the output voltage signal terminal S4.

Supplementary Descriptions of the Above Exemplary Embodiment

The present disclosure is not limited by the exemplary embodiment described above and may be modified within a scope not departing from the gist; for example, as described below.

In the level shift section 2 of the level shifter 1 of the present disclosure, the second transistor T2 may be structured by a lateral diffused-type field effect transistor (an LDMOSFET). This transistor has a structure with a higher breakdown voltage.

In the present disclosure, the first resistor R1 of the level shift section 2 may be an IGFET of the second conduction type. In an IGFET of the second conduction type, the channel formation region may be utilized as a resistor.

In the present disclosure, the circuit configuration of the buffer section 3 of the level shifter 1 may be replaced. For example, the buffer section 3 may have a two-stage circuit configuration of the second inverter 31 and the third inverter 32, or may have a circuit configuration with four or more stages. Moreover, the fifth transistor T5, seventh transistor T7 and ninth transistor T9 of the first inverter 30, second inverter 31 and third inverter 32 may be resistors.

A level shifter according to a first aspect of the present disclosure includes: a power supply system current source including: a first resistor having a first end that is connected to a first power supply voltage, and having a second end, and a first transistor having a first main electrode and a first control electrode that are connected to the second end of the first resistor, and having a second main electrode that is connected to a second power supply voltage having a lower voltage than the first power supply voltage; a second transistor having a third main electrode that is connected to an input voltage signal terminal, a fourth main electrode that is connected to an output voltage signal terminal, and a second control electrode that is connected to a third power supply voltage having a voltage that is lower than the first power supply voltage and higher than the second power supply voltage; a second resistor having a first end that is connected between the fourth main electrode and the output voltage signal terminal, and having a second end; and a third transistor having a fifth main electrode that is connected to the second end of the second resistor, a sixth main electrode that is connected to the second power supply voltage, and a third control electrode that is connected to the first control electrode.

The level shifter according to the first aspect is provided with the power supply system current source, the second transistor, the second resistor and the third transistor. The power supply system current source includes the first resistor and the first transistor. The one end of the first resistor is connected to the first power supply voltage. The first main electrode and first control electrode of the first transistor is connected to the other end of the first resistor, and the second main electrode of the first transistor is connected to the second power supply voltage. The second power supply voltage is a voltage lower than the first power supply voltage.

The third main electrode of the second transistor is connected to the input voltage signal terminal, and the fourth main electrode of the second transistor is connected to the output voltage signal terminal. The second control electrode of the second transistor is connected to the third power supply voltage. The third power supply voltage is a voltage lower than the first power supply voltage but higher than the second power supply voltage.

The one end of the second resistor is connected to between the fourth main electrode of the second transistor and the output voltage signal terminal. The fifth main electrode of the third transistor is connected to the other end of the second resistor, and the sixth main electrode of the third transistor is connected to the second power supply voltage. The third control electrode of the third transistor is connected to the first control electrode of the first transistor.

Because the third control electrode of the third transistor is connected to the first control electrode of the first transistor, the third transistor constitutes a current mirror circuit with the power supply system current source (the first transistor). At the power supply system current source, a current flowing from the first power supply voltage through the first resistor and first transistor to the second power supply voltage changes in accordance with a change in the voltage level of the first power supply voltage. Thus, the power supply system current source implements current regulation. When an input voltage signal is applied to the input voltage signal terminal, the input voltage signal passes through the second transistor, the second resistor and the third transistor, and is outputted to the second power supply voltage as a current. Thus, the current flowing in the third transistor constituting the current mirror circuit is regulated in accordance with changes in the current flowing in the first transistor of the power supply system current source.

Therefore, because the current flowing in the second resistor is regulated in accordance with the current regulation of the power supply system current source, the voltage level of a threshold voltage of the input voltage signal may be changed.

In a level shifter according to a second aspect of the present disclosure, in the level shifter according to the first aspect, an electrostatic protection component is disposed between the input voltage signal terminal and the third main electrode of the second transistor.

According to the level shifter according to the second aspect, because the electrostatic protection component is disposed between the input voltage signal terminal and the second transistor, electrostatic breakdown of the second transistor may be prevented or effectively suppressed. Therefore, electrostatic breakdown endurance of the level shifter may be improved.

In a level shifter according to a third aspect of the present disclosure, in the level shifter according to the first aspect or the second aspect, an electrostatic breakdown voltage of the second transistor is higher than respective electrostatic breakdown voltages of the first transistor and the third transistor.

According to the level shifter according to the third aspect, because the electrostatic breakdown voltage of the second transistor is specified to be higher, electrostatic breakdown of the second transistor may be prevented or effectively suppressed. Therefore, electrostatic breakdown endurance of the level shifter may be improved.

In a level shifter according to a fourth aspect of the present disclosure, in the level shifter according to any one of the first to third aspects, the second transistor includes a vertical diffused-type transistor.

According to the level shifter according to the fourth aspect, because the second transistor is a vertical diffused-type transistor, the electrostatic breakdown voltage of the second transistor may be improved. Therefore, electrostatic breakdown endurance of the level shifter may be improved.

In a level shifter according to a fifth aspect of the present disclosure, the level shifter according to any one of the first to fourth aspects, further includes a buffer section that shapes a waveform of an output voltage signal and that is connected to the output voltage signal terminal.

According to the level shifter according to the fifth aspect, the waveform of an output voltage signal that is outputted from the output voltage signal terminal may be shaped using the buffer section, and ultimately the shaped output voltage signal may be outputted.

The level shifter according to the present disclosure provides an excellent effect in that a threshold voltage of an input voltage signal may be changed in accordance with a change in a power supply voltage.

What is claimed is:

1. A level shifter, comprising:
    a power supply system current source including:
        a first resistor having a first end that is connected to a first power supply voltage, and having a second end, and
        a first transistor having a first main electrode and a first control electrode that are connected to the second end of the first resistor, and having a second main electrode that is connected to a second power supply voltage having a lower voltage than the first power supply voltage;
    a second transistor having a third main electrode that is connected to an input voltage signal terminal, a fourth main electrode that is connected to an output voltage signal terminal, and a second control electrode that is connected to a third power supply voltage having a voltage that is lower than the first power supply voltage and higher than the second power supply voltage;
    a second resistor having a first end that is connected between the fourth main electrode and the output voltage signal terminal, and having a second end; and
    a third transistor having a fifth main electrode that is connected to the second end of the second resistor, a sixth main electrode that is connected to the second power supply voltage, and a third control electrode that is connected to the first control electrode.

2. The level shifter according to claim 1, wherein an electrostatic protection component is disposed between the input voltage signal terminal and the third main electrode of the second transistor.

3. The level shifter according to claim 1, wherein an electrostatic breakdown voltage of the second transistor is higher than respective electrostatic breakdown voltages of the first transistor and the third transistor.

4. The level shifter according to claim 1, wherein the second transistor includes a vertical diffused-type transistor.

5. The level shifter according to claim 1, further comprising a buffer section that shapes a waveform of an output voltage signal and that is connected to the output voltage signal terminal.

* * * * *

UNITED STATES PATENT AND TRADEMARK OFFICE
CERTIFICATE OF CORRECTION

PATENT NO. : 10,128,848 B2
APPLICATION NO. : 15/854870
DATED : November 13, 2018
INVENTOR(S) : Junichi Matsubara Page 1 of 1

It is certified that error appears in the above-identified patent and that said Letters Patent is hereby corrected as shown below:

On the Title Page

The sentence "This patent is subject to a terminal disclaimer." should be deleted.

Signed and Sealed this
Twelfth Day of March, 2019

Andrei Iancu
*Director of the United States Patent and Trademark Office*